United States Patent
Tsukidate

(10) Patent No.: US 7,061,809 B2
(45) Date of Patent: Jun. 13, 2006

(54) NONVOLATILE SEMICONDUCTOR MEMORY DEVICE INCLUDING A PLURALITY OF BLOCKS AND A SENSING CIRCUIT PROVIDED IN EACH OF THE BLOCKS FOR COMPARING DATA WITH A REFERENCE SIGNAL HAVING A LOAD IMPOSED THEREON

(76) Inventor: Yoshihiro Tsukidate, c/o Fujitsu Limited, 1-1, Kamikodanaka 4-chome, Nakahara-ku, Kawasaki-shi, Kanagawa 211-8588 (JP)

( * ) Notice: Subject to any disclaimer, the term of this patent is extended or adjusted under 35 U.S.C. 154(b) by 0 days.

(21) Appl. No.: 10/633,535

(22) Filed: Aug. 5, 2003

(65) Prior Publication Data

US 2004/0052119 A1    Mar. 18, 2004

(30) Foreign Application Priority Data

Sep. 13, 2002    (JP)    ............................. 2002-268317

(51) Int. Cl.
    *G11C 16/06*    (2006.01)
(52) U.S. Cl. .................. 365/185.21; 365/210; 365/196
(58) Field of Classification Search .......... 365/185.21, 365/185.2, 185.11, 210, 207
    See application file for complete search history.

(56) References Cited

U.S. PATENT DOCUMENTS

| 5,297,079 A | * | 3/1994 | Ha ............................... 365/182 |
| 5,572,474 A | * | 11/1996 | Sheen et al. ................. 365/207 |
| 5,917,753 A | * | 6/1999 | Dallabora et al. ...... 365/185.21 |
| 5,982,662 A | * | 11/1999 | Kobayashi et al. .... 365/185.03 |
| 6,108,259 A | * | 8/2000 | Choi et al. ................... 365/210 |
| 6,339,556 B1 | | 1/2002 | Watanabe |
| 6,385,091 B1 | * | 5/2002 | Pekny ..................... 365/185.2 |
| 6,504,778 B1 | * | 1/2003 | Uekubo ...................... 365/207 |

FOREIGN PATENT DOCUMENTS

JP    2001-143487    5/2001

\* cited by examiner

*Primary Examiner*—Thong Q. Le
(74) *Attorney, Agent, or Firm*—Arent Fox PLLC

(57) ABSTRACT

A nonvolatile semiconductor memory device includes a plurality of blocks each having a memory cell array, a reference cell, a signal line that supplies a reference signal read from the reference cell to each of the plurality of blocks, a reference load circuit which is provided in each of the plurality of blocks, and exerts a load on the reference signal that is identical to a load imposed on data that is read from the memory cell array, and a sensing circuit which is provided in each of the plurality of blocks, and compares the data with the reference signal having the load imposed thereon by the reference load circuit so as to sense the data.

10 Claims, 4 Drawing Sheets

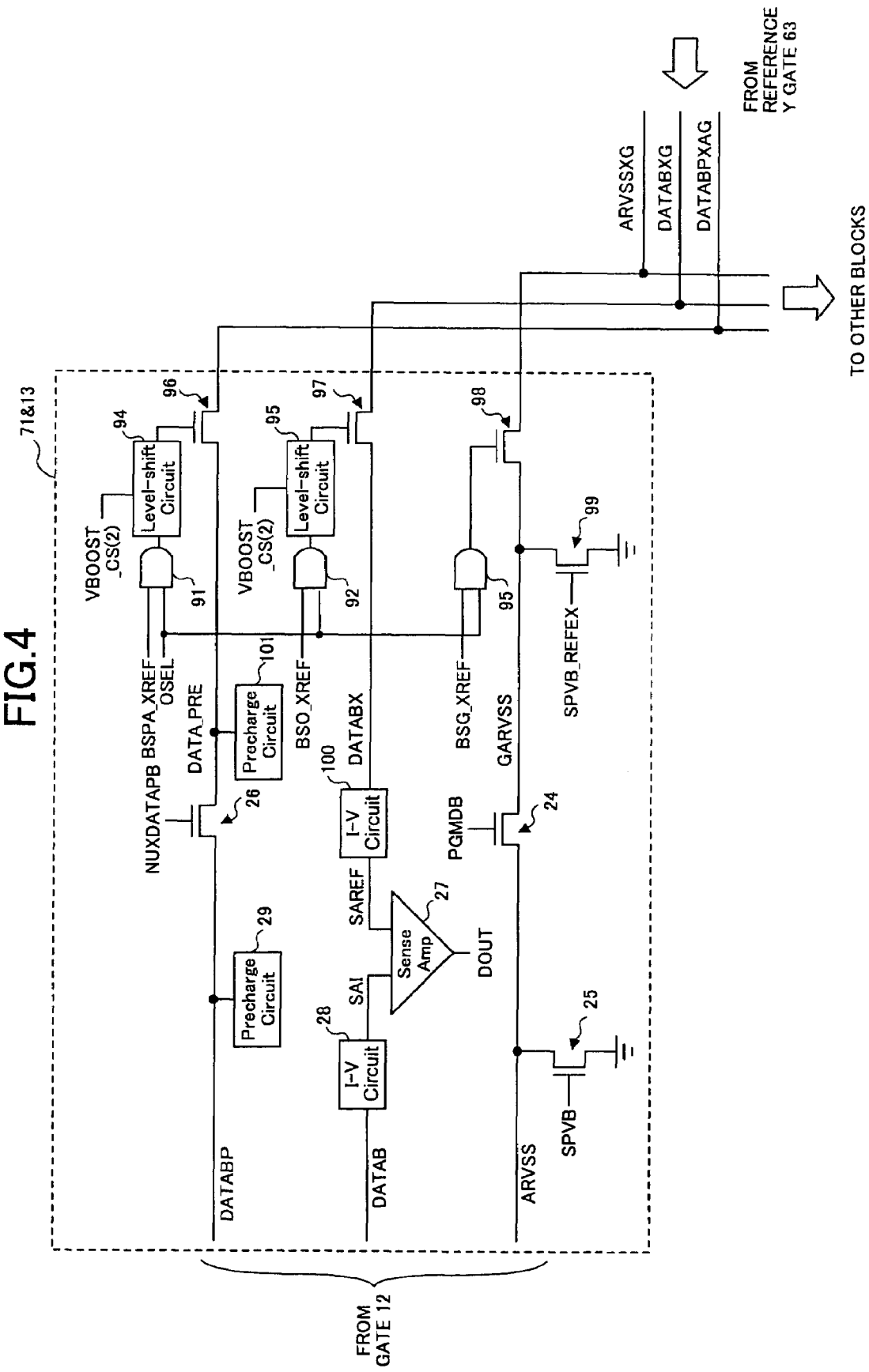

NONVOLATILE SEMICONDUCTOR MEMORY DEVICE INCLUDING A PLURALITY OF BLOCKS AND A SENSING CIRCUIT PROVIDED IN EACH OF THE BLOCKS FOR COMPARING DATA WITH A REFERENCE SIGNAL HAVING A LOAD IMPOSED THEREON

CROSS-REFERENCE TO RELATED APPLICATIONS

The present application is based upon and claims the benefit of priority from the prior Japanese Patent Application No. 2002-268317 filed on Sep. 13, 2002, with the Japanese Patent Office, the entire contents of which are incorporated herein by reference.

BACKGROUND OF THE INVENTION

1. Field of the Invention

The present invention generally relates to nonvolatile semiconductor memory devices, and particularly relates to a nonvolatile semiconductor memory device in which a memory cell array is divided into a plurality of blocks.

2. Description of the Related Art

In nonvolatile semiconductor memory devices, reference-purpose memory cells, which are separate from data memory cells, are used as a reference in determining the level of data that is retrieved from the data memory cells. Such reference memory cells are arranged not as part of a memory cell array but as part of peripheral circuits of the memory cell array. One set of reference memory cells is provided for one memory device. Where a memory cell array is divided into a plurality of blocks, the outputs of the reference cells need to be distributed to sense amplifiers of each one of the blocks.

FIG. 1 is an illustrative drawing for explaining the reading of data from a flash memory device.

In FIG. 1, a memory cell array 11 includes a plurality of memory cell transistors 21, a plurality of word lines WL, and a plurality of bit lines MBL. The memory cell array 11 is a virtual ground memory array in which bit lines are formed by diffusion layers, one bit line of each pair of bit lines that is coupled to the ground potential serving as a source, and the other bit line that is coupled to the power supply potential serving as a drain. In such a virtual ground memory array, bit lines are shared by memory cells that are adjacent to each other in the direction of word-line extension.

A Y gate 12 includes a plurality of transistors 22 and 23. In response to decoding signals CS(0), CS(1), CS(2), BSD(0), BSG(0), and BSP(0) reflecting an address for selecting a bit line, the Y gate 12 selects a bit line MBL of the memory cell array. As a power supply potential for the decoding signals CS(n), a boosted potential VBOOST_CSG is used that is generated by boosting a power supply potential VCC inside the device. The Y gate 12 is shown in a simplified form for the sake of illustration in FIG. 1, but actually has a plurality of transistors 22 and 23 arranged in such a manner as to select a bit line MBL corresponding to a single memory cell from a plurality of bit lines MBL.

A sensing circuit 13 includes transistors 24 through 26, a sense amplifier 27, a current-to-voltage conversion circuit 28, and a precharge circuit 29.

The bit line MBL that serves as a drain of a memory cell being accessed for reading data from the memory cell array 11 is coupled to the current-to-voltage conversion circuit 28 as DATAB through a transistor 23 that is coupled to BSD(0) in the Y gate 12. The boosted potential VBOOST_CSG is used as a power supply potential for BSD(0). The output of the current-to-voltage conversion circuit 28 is supplied to the sense amplifier 27.

The bit line MBL that serves as a source of the memory cell being accessed for reading data from the memory cell array 11 is coupled to the drain of the transistor 25 as ARVSS through a transistor 23 that is coupled to BSG(0) in the Y gate 12. The power supply potential VCC is used as a power supply potential for BSG(0). During a routine read operation, SPVB that is applied to the gate node of the transistor 25 is set to HIGH, thereby coupling ARVSS to the ground potential.

A bit line adjacent to the bit line that is serving as the drain of the read-accessed memory cell is coupled to the precharge circuit 29 as DATABP through a transistor 23 that is coupled to BSP(0) in the Y gate 12. The boosted potential VBOOST_CSG is used as a power supply potential for BSP(0). The precharge circuit 29 charges the bit line that is adjacent to the bit line serving as the drain at the time of memory cell reading. The precharge circuit 29 has the same circuit structure as the current-to-voltage conversion circuit 28, and supplies a potential to the adjacent bit line that is the same as the potential that is set to the drain bit line. With this provision, no current runs across these bit lines, providing for only the current of the accessed memory cell to be detected by the current-to-voltage conversion circuit 28.

A similar circuit structure is provided for a reference-cell portion so as to attain the same operation as that performed on the memory-cell portion.

A reference-cell circuit 14 includes a plurality of cell transistors 31 having the same structure as the memory-cell transistors 21, and further includes a word line SBSR for reading a reference cell 31 (shown as encircled) that is one of the cell transistors.

A reference Y gate 15 includes a plurality of transistors 32 and 33. The transistors 32 are driven by the boosted potential VBOOST_CSG. Transistors 33 that correspond to the drain bit line and the adjacent bit line are driven by the boosted potential VBOST_CSG, and a transistor 33 that corresponds to the source bit line is driven by the power supply potential VCC.

A reference load circuit 16 includes a transistor 34, a current-to-voltage conversion circuit 35, and a precharge circuit 36. The reference load circuit 16 put the load on a signal read from the reference cell where the load is the same as that imposed on a signal that is read from the read-accessed memory cell of the memory cell array 11. In this manner, the reference load circuit 16 makes sure that the memory data signal and the reference signal are compared with each other under the same conditions.

The bit line serving as the drain of the reference cell 31 is coupled to the current-to-voltage conversion circuit 35 as DATABX through the reference Y gate 15. An output SAREF of the current-to-voltage conversion circuit 35 is supplied to the sense amplifier 27 of the sensing circuit 13.

A bit line that serves as the source of the reference cell 31 is coupled to the drain of the transistor 34 as GARVSS through the reference Y gate 15. During a routine read operation, SPVB_REFEX that is applied to the gate node of the transistor 34 is set to HIGH, thereby coupling GARVSS to the ground potential VSS.

A bit line adjacent to the drain bit line of the reference cell 31 is coupled to the precharge circuit 36 as DATAB_PRE through the reference Y gate 15. The precharge circuit 36 charges the bit line that is adjacent to the bit line serving as the drain at the time of memory cell reading. The precharge circuit 36 has the same circuit structure as the current-to-voltage conversion circuit 35, and supplies a potential to the adjacent bit line that is the same as the potential being set to the drain bit line. With this provision, no current runs across these bit lines, providing for only the current of the reference cell 31 to be detected by the current-to-voltage conversion circuit 35.

When the memory cell transistor 21 that is encircled in FIG. 1 is read, WL(2) is selectively activated, and the Y gate 12 selects relevant bit lines. The word line SBSR of the reference-cell circuit 14 is also activated. SPVB, SPVP_REFEX, PGMDB, and MUXDATAPB are all set to HIGH, and GARVSS and ARVSS are set to the ground potential VSS, with DATABP and DATAB_PRE being short-circuited. The sense amplifier 27 compares a current of the reference cell 31 with a current Ic of the memory cell 21. If Ic is larger, data is ascertained to be "1". Otherwise, data is ascertained as "0".

Even if the potential of ARVSS rises due to an increase of the current of ARVSS, GARVSS will have the same potential rise since the short-circuiting of ARVSS and GARVSS. This ensures that the read conditions are always the same between the reference cell and the read-accessed memory cell. By the same token, DATABP and DATAB_PRE are short-circuited, so that the read conditions are always the same between the reference cell and the read-accessed memory cell.

There is a related-art document that discloses a reference cell array and a plurality of cell arrays (Japanese Patent Application Publication No. 2001-143487).

When the memory cell array 11 is divided into four blocks, for example, the sensing circuit 13 needs to be provided for each of the four blocks. If a single set of the reference-cell circuit 14, the reference Y gate 15, and the reference load circuit 16 is provided for shared use by the four blocks, the following problems will be encountered.

Device characteristics may differ from device to device due to differences in device positions and layouts. The reference circuit may have matching characteristics with the first block, which provides proper data sensing. This reference circuit may not have matching characteristics with other blocks, resulting in data sensing being unable to be properly performed. If the boosted potential VBOOST_CSG differs between the reference Y gate 15 and the Y gate 12 that are positioned apart from each other, the output of the Y gate 12 cannot be properly compared with the output of the reference Y gate 15.

In this manner, circuit characteristics and drive potentials vary from block to block. This gives rise to a problem that no sensible comparison can be made for data sensing between the reference cell and a memory cell of each block.

Accordingly, there is a need for a nonvolatile semiconductor memory device that ensures proper comparison between a reference circuit and each memory cell block when a memory cell array is divided into a plurality of blocks.

SUMMARY OF THE INVENTION

It is a general object of the present invention to provide a nonvolatile semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, including a plurality of blocks each having a memory cell array, a reference cell, a signal line that supplies a reference signal read from the reference cell to each of the plurality of blocks, a reference load circuit which is provided in each of the plurality of blocks, and exerts a load on the reference signal that is identical to a load imposed on data that is read from the memory cell array, and a sensing circuit which is provided in each of the plurality of blocks, and compares the data with the reference signal having the load imposed thereon by the reference load circuit so as to sense the data.

In the configuration as described above, circuit loads (e.g., current-to-voltage conversion circuits, precharge circuits, pass gates, etc.) that may affect the voltage and current levels of the data signal and the reference signal, which are to be compared with each other, are located in each block such as to be close to each other between the data signal and the reference signal. Even if device characteristics, the timing of the sense amplifier, the level of the boosted potential, etc., vary from block to block in the plurality of blocks, this provision ensures that each block provides the same conditions for comparison of the data signal and the reference signal, thereby achieving stable and proper data sensing operations.

Other objects and further features of the present invention will be apparent from the following detailed description when read in conjunction with the accompanying drawings.

BRIEF DESCRIPTION OF THE DRAWINGS

FIG. 4 is a circuit diagram showing a reference load circuit and a sensing circuit in any given block.

DESCRIPTION OF THE PREFERRED EMBODIMENTS

In the following, embodiments of the present invention will be described with reference to the accompanying drawings.

Figure 1:
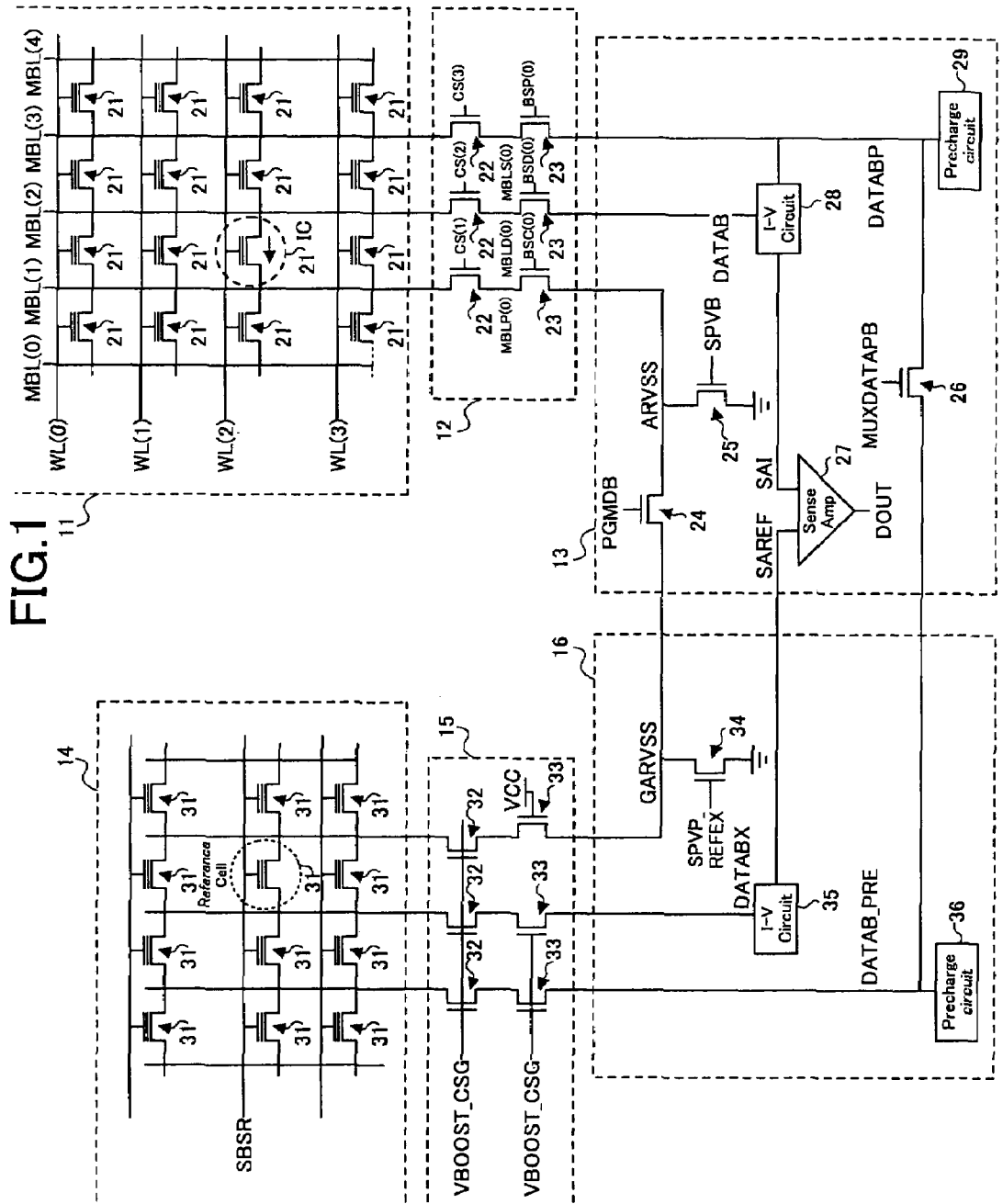
FIG. 1 is an illustrative drawing for explaining the reading of data from a flash memory device.
Figure 2:
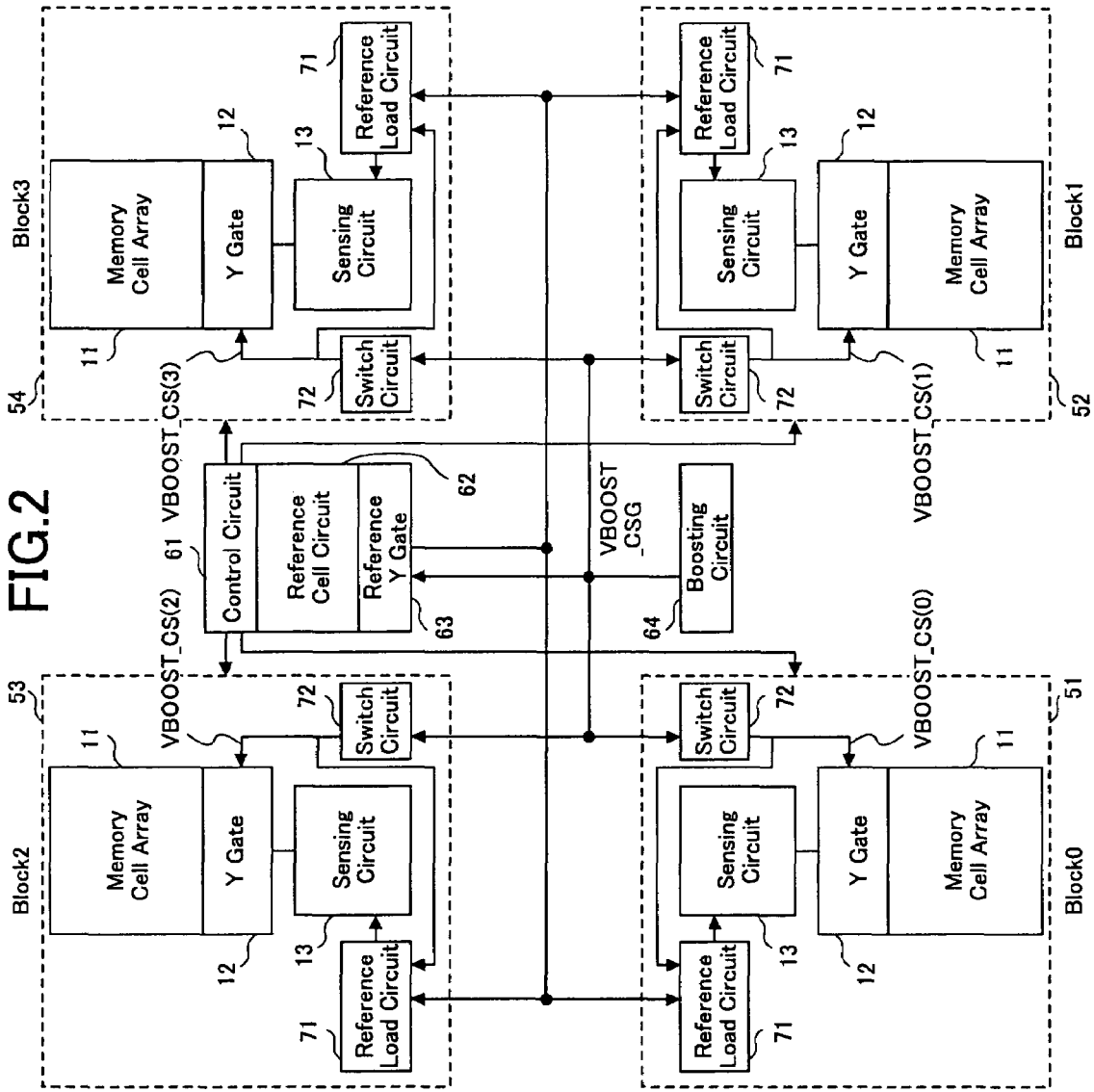
FIG. 2 is a block diagram showing a core circuit and its peripheral circuits that constitute a nonvolatile semiconductor memory device according to the present invention.

FIG. 2 is a block diagram showing a core circuit and its peripheral circuits that constitute a nonvolatile semiconductor memory device according to the present invention. In FIG. 1, the same elements as those of FIG. 1 are referred to by the same numerals, and a description thereof will be omitted.

The nonvolatile semiconductor memory device of FIG. 2 include a plurality of blocks 51 through 54, a control circuit 61, a reference cell circuit 62, a reference Y gate 63, and a boosting circuit 64. Each of the blocks 51 through 54 includes the memory cell array 11, the Y gate 12, the sensing circuit 13, a reference load circuit 71, and a switch circuit 72.

The control circuit 61 supplies signals to every relevant part in accordance with a specified operation mode selected from a read operation, a write operation, and an erase operation, thereby controlling the operations of the blocks 51 through 54 and the reference cell circuit 62. The reference cell circuit 62 is the same as the reference-cell circuit 14 shown in FIG. 1, and includes a reference cell. The reference Y gate 63 corresponds to a portion (i.e., the transistors 32) of the reference Y gate 15 shown in FIG. 1. The remaining portion (i.e., the transistors 33) of the reference Y gate 15 of FIG. 1 is separately located in each of the blocks 51 through 54. By the same token, a portion that corresponds to the reference load circuit 16 shown in FIG. 1 is located in each of the blocks 51 through 54. The reference load circuit 71 of each of the blocks 51 through 54 has a structure that includes a portion of the reference Y gate 15 and the entirety of the reference load circuit 16.

The boosting circuit 64 generates a boosted potential from an external power supply potential, and supplies the generated boosted potential VBOOST_CSG to the blocks 51 through 54. In each of the blocks 51 through 54, the switch circuit 72 is closed to provide a path when the corresponding block is selected. As a result, the boosted potential VBOOST_CSG is supplied from the boosting circuit 64 to the Y gate 12 and the reference load circuit 71 as a boosted potential VBOOST_CS(n) (n=0, 1, 2, or 3: indicating each block).

Figure 3:
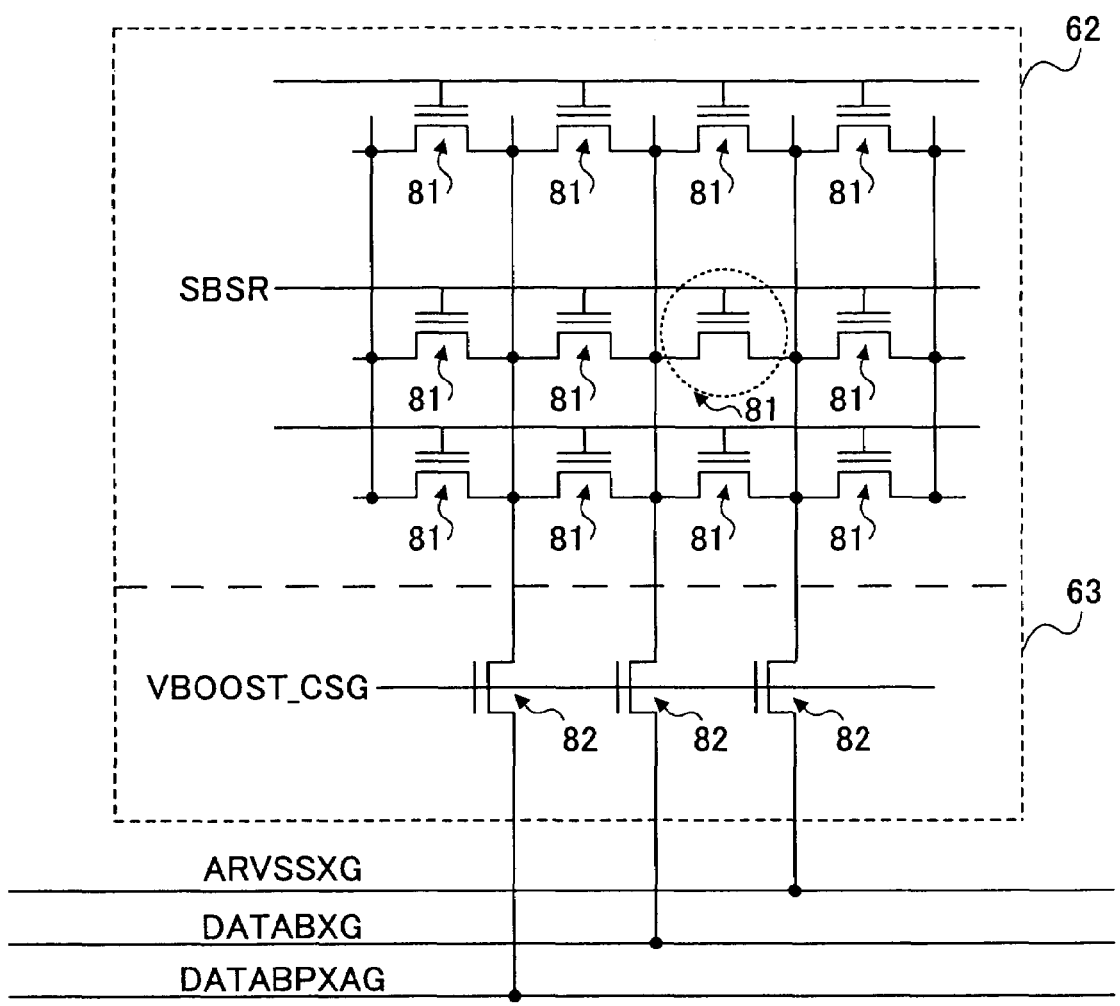
FIG. 3 is a circuit diagram showing the construction of a reference cell circuit and a reference Y gate.

FIG. 3 is a circuit diagram showing a construction of the reference cell circuit 62 and the reference Y gate 63.

As shown in FIG. 3, the reference cell circuit 62 includes a plurality of cell transistors 81 having the same structure as the memory cell transistor 21, and further includes a word line SBSR for reading data from a reference cell 81 (shown as encircled) that is one of the cell transistors. The reference Y gate 63 includes a plurality of transistors 82. The transistors 82 receive the boosted potential VBOOST_CSG at the gate node thereof to become conductive, thereby supplying the source potential of the reference cell 81 as ARVSSXG, the drain potential of the reference cell 81 as DATABXG, and the electric current of the bit line adjacent to the drain as DATABPXAG, to each of the blocks 51 through 54.

FIG. 4 is a circuit diagram showing the reference load circuit 71 and the sensing circuit 13 in any given block among the blocks 51 through 54.

In FIG. 4, the sensing circuit 13 includes the transistors 24 through 26, the sense amplifier 27, the current-to-voltage conversion circuit 28, and the precharge circuit 29. The reference load circuit 71 includes AND gates 91 through 93, level-shift circuits 94 and 95, transistors 96 through 99, a current-to-voltage conversion circuit 100, and a precharge circuit 101.

The transistors 96 through 98 correspond to the transistors 33 of the reference Y gate 15 shown in FIG. 1. Each of the AND gates 91 through 93 has the first input thereof receiving a signal QSEL that turns to HIGH in response to the selection of the relevant block. The AND gates 91 through 93 have the second input thereof receiving signals BSPA_XREF, BSD_XREF, and BSG_XREF, respectively. These signals are supplied from the control circuit 61, and turn to HIGH when supplying the respective signals ARVSSXG, DATABXG, and DATABPXAG to the reference load circuit 71. When the signal QSEL is changed to HIGH in response to the selection of the corresponding block, and the signals BSPA_XREF, BSD_XREF, and BSG_XREF are HIGH, the AND gates 91 through 93 produce a HIGH output.

The level-shift circuits 94 and 95 receive the boosted potential VBOOST_CS(n), and further receive the outputs of the AND gates 91 and 92, respectively. The level-shift circuits 94 and 95 shift the output levels of the AND gates to the level of the boosted potential VBOOST_CS(n). The level-converted signals output from the level-shift circuits 94 and 95 are applied to the gate nodes of the transistors 96 and 97, respectively, which serve as a pass gate. In this manner, a sufficient threshold voltage is secured for the transistors 96 and 97, so that the signals ARVSSXG and DATABXG from the reference Y gate 63 are supplied to the precharge circuit 101 and the current-to-voltage conversion circuit 100, respectively, without changing the potential levels of these signals. The output of the AND gate 93 is supplied to the gate node of the transistor 98 directly without using an intervening level shifter. Since the signal DATAB-PXAG passing through the pass-gate transistor 98 is supposed to be at the ground potential, the use of the boosted potential is not necessary to make the signal properly pass through the pass-gate transistor.

With this provision, a bit line that corresponds to the drain of the reference cell 81 shown in FIG. 3 is coupled as DATABX to the current-to-voltage conversion circuit 100. The current-to-voltage conversion circuit 100 converts the current signal to the voltage signal, which is an output SAREF that is supplied to the sense amplifier 27 of the sensing circuit 13. The current-to-voltage conversion circuit 100 has the same circuit structure as the current-to-voltage conversion circuit 28, and thus has the same characteristics under ideal circumstances.

The bit line that serves as the source of the reference cell 81 is coupled as GARVSS to the drain of the transistor 99. During a routine read operation, the gate node of the transistor 99 receives SPVB_REFEX that is HIGH, thereby coupling GARVSS to the ground potential VSS. The transistor 99 has the same circuit device standard as the transistor 25, and thus has the same characteristics under the ideal circumstances.

The bit line that is adjacent to the drain bit line of the reference cell 81 is coupled to the precharge circuit 101 as DATAB_PRE. The precharge circuit 101 charges the bit line that is adjacent to the bit line serving as the drain at the time of memory cell reading. The precharge circuit 101 has the same circuit structure as the current-to-voltage conversion circuit 100, and supplies a potential to the adjacent bit line that is the same as the potential that is set to the drain bit line. With this provision, no current runs across these bit lines, providing for only the current of the reference cell 81 to be detected by the current-to-voltage conversion circuit 100. The precharge circuit 101 has the same circuit structure as precharge circuit 29, and thus has the same characteristics under ideal circumstances.

The memory cell array 11 shown in FIG. 2 has the same structure as the memory cell array 11 shown in FIG. 1. When the memory cell transistor 21 of the memory cell array 11 is to be read, specified word line is selectively activated, and the Y gate 12 selects relevant bit lines. The word line SBSR of the reference-cell circuit 62 shown in FIG. 3 is also activated. SPVB that is the gate potential of the transistor 25 shown in FIG. 4, SPVP_REFEX that is the gate potential of the transistor 99, PGMDB that is the gate potential of the transistor 24, and MUXDATAPB that is the gate potential of the transistor 26 are all set to HIGH, and GARVSS and ARVSS are set to the ground potential VSS, with DATABP and DATAB_PRE being short-circuited.

The sense amplifier 27 compares a current of the reference cell 81 with a current of the read-accessed memory cell 21. If the current of the read-accessed memory cell 21 is larger, data is ascertained to be "1". Otherwise, data is ascertained as "0".

In the configuration as described above, circuit elements provided as a pair, i.e., the current-to-voltage conversion circuit 28 and the current-to-voltage conversion circuit 100, the precharge circuit 29 and the precharge circuit 101, the transistor 25 and the transistor 99, and the pass gate 23 and the pass gates 96 through 98, may affect the voltage and current levels of signals to be compared, but are located close to each other in each block. It may be the case that device characteristics, the timing of the sense amplifier 27, and the level of the boosted potential VBOOST_CS(n) may vary from block to block in the blocks 51 through 54. Even if this is the case, the configuration as described above ensures that each block provides the same conditions for comparison, thereby achieving stable and proper data sensing operations.

In the embodiment described above, only one set of the transistors 82 of the reference Y gate 63 is provided, and is situated close to the reference cell circuit 62 rather than being provided in each block. Since the pass-gate transistors 96 through 98 are located at the stage following the transistors 82, a slight difference between the boosted potential VBOOST_CS(n) and the boosted potential VBOOST_CSG may not be likely to create much of a problem. Alternatively, the transistors 82 of the reference Y gate 63 may be provided in each of the blocks so as to provide one set to each block.

Further, the present invention is not limited to these embodiments, but various variations and modifications may be made without departing from the scope of the present invention.

What is claimed is:

1. A nonvolatile semiconductor memory device, comprising:
   a plurality of blocks each having a memory cell array;
   a reference cell;
   a signal line that supplies a reference signal read from said reference cell to each of said plurality of blocks;
   a plurality of reference load circuits, each of which is provided in each of said plurality of blocks, and imposes a load on the reference signal that is identical to a load imposed on data that is read from said memory cell array; and
   a plurality of sensing circuits, each of which is provided in each of said plurality of blocks, and compares the data with the reference signal having the load imposed thereon by said reference load circuit so as to sense the data.

2. The nonvolatile semiconductor memory device as claimed in claim 1, wherein said reference load circuit includes a pass gate that allows the reference signal to go therethrough only in one of the blocks that is selected.

3. The nonvolatile semiconductor memory device as claimed in claim 2, further comprising a Y gate which is provided in each of said plurality of blocks, and selects the data read from said memory cell array, wherein a gate at a last stage of said Y gate and said pass gate are structurally identical as circuit elements, and are driven by the same potential.

4. The nonvolatile semiconductor memory device as claimed in claim 3, further comprising a gate that allows the reference signal to go therethrough, and corresponds to a gate other than that of the last stage of said Y gate, said gate being provided in common for each of said plurality of blocks and provided in the vicinity of said reference cell.

5. The nonvolatile semiconductor memory device as claimed in claim 3, further comprising: a boosting circuit which generates a boosted potential that drives the gate at the last stage of said Y gate and said pass gate; a power supply line which supplies the boosted potential generated by said boosting circuit to each of said plurality of blocks; and a switch circuit which is provided in each of said plurality of blocks, and supplies the boosted potential to the gate at the last stage of said Y gate and said pass gate only in said one of the blocks that is selected.

6. The nonvolatile semiconductor memory device as claimed in claim 1, wherein said sensing circuit includes a first current-to-voltage conversion circuit which converts a current to a voltage with respect to the data, and said reference load circuit includes a second current-to-voltage conversion circuit which converts a current to a voltage with respect to the reference signal, wherein said first current-to-voltage conversion circuit and said second current-to-voltage conversion circuit have an identical circuit structure.

7. The nonvolatile semiconductor memory device as claimed in claim 1, wherein said sensing circuit includes a first grounding circuit which couples a source potential with respect to the data to a ground, and said reference load circuit includes a second grounding circuit which couples a source potential with respect to the reference signal to the ground, wherein said first grounding circuit and said second grounding circuit have an identical circuit structure.

8. The nonvolatile semiconductor memory device as claimed in claim 7, wherein said sensing circuit further includes a circuit which short-circuits the source potential with respect to the data to the source potential with respect to the reference signal.

9. The nonvolatile semiconductor memory device as claimed in claim 1, wherein said sensing circuit includes a first precharge circuit which precharges a potential of a bit line adjacent to a drain bit line with respect to the data, and said reference load circuit includes a second precharge circuit which precharges a potential of a bit line adjacent to a drain bit line with respect to the reference signal, wherein said first precharge circuit and said second precharge circuit have an identical circuit structure.

10. The nonvolatile semiconductor memory device as claimed in claim 9, wherein said sensing circuit further includes a circuit which short-circuits the potential of the bit line adjacent to the drain bit line with respect to the data to the potential of the bit line adjacent to the drain bit line with respect to the reference signal.

* * * * *